(12) United States Patent
West et al.

(10) Patent No.: US 8,738,664 B2
(45) Date of Patent: May 27, 2014

(54) SYSTEM AND METHOD FOR GENERATING DIAGNOSTIC TEST FILES ASSOCIATED WITH A BATTERY PACK

(75) Inventors: Jeffrey John West, Rochester Hills, MI (US); John Longnecker, Livonia, MI (US)

(73) Assignee: LG Chem, Ltd., Seoul (KR)

( * ) Notice: Subject to any disclaimer, the term of this patent is extended or adjusted under 35 U.S.C. 154(b) by 92 days.

(21) Appl. No.: 13/479,164

(22) Filed: May 23, 2012

(65) Prior Publication Data
US 2013/0318127 A1 Nov. 28, 2013

(51) Int. Cl.
*G06F 17/30* (2006.01)

(52) U.S. Cl.
CPC .................. *G06F 17/30286* (2013.01)
USPC .......... 707/803; 707/E17.01; 701/29; 701/31; 324/644; 324/632

(58) Field of Classification Search
CPC .............. G06F 17/30; G06F 17/30286; G06F 17/30595; G06F 17/30067
USPC ......... 707/634, 659, 761, 755, 756, 791, 795, 707/803, E17.01; 701/29, 31, 32, 33, 35, 701/36; 324/644, 632, 637, 642, 504, 537
See application file for complete search history.

(56) References Cited

U.S. PATENT DOCUMENTS

| | | | | |
|---|---|---|---|---|
| 4,342,022 A * | 7/1982 | Nichol | ........................... | 340/455 |
| 5,257,190 A * | 10/1993 | Crane | ........................... | 701/33.4 |
| 5,450,321 A * | 9/1995 | Crane | ........................... | 701/31.6 |
| 5,884,202 A * | 3/1999 | Arjomand | ..................... | 701/31.4 |
| 6,006,016 A * | 12/1999 | Faigon et al. | ................... | 714/48 |
| 6,094,609 A * | 7/2000 | Arjomand | ..................... | 701/31.5 |
| 6,169,387 B1* | 1/2001 | Kaib | ............................. | 320/132 |
| 6,459,279 B2* | 10/2002 | Moyes | ........................ | 324/644 |
| 7,124,003 B1* | 10/2006 | West et al. | ................... | 701/32.8 |
| 7,239,946 B2 | 7/2007 | Sowa | | |
| 8,428,813 B2* | 4/2013 | Gilbert | ........................ | 701/31.4 |
| RE44,299 E * | 6/2013 | Backman | ........................ | 713/2 |
| 2001/0007985 A1* | 7/2001 | Rothberg et al. | ................. | 707/1 |
| 2005/0138081 A1* | 6/2005 | Alshab et al. | ................. | 707/200 |

(Continued)

OTHER PUBLICATIONS

Brenier, A. ; McDowall, J. ; Morin, C.—"A new approach to the qualification of lithium-based battery systems"—Telecommunications Energy Conference, 2004. INTELEC 2004. 26th Annual International—Date Sep. 19-23, 2004 (pp. 12-18).*

(Continued)

*Primary Examiner* — Anh Ly
(74) *Attorney, Agent, or Firm* — Buckert Patent & Trademark Law Firm, P.C.; John F. Buckert

(57) ABSTRACT

A method for generating diagnostic test files associated with a battery pack is provided. The method includes providing a diagnostic test data table having a plurality of records. A first record is associated with a first diagnostic test. The first record has a first parameter identifier and a first value. The method further includes generating a diagnostic test parameter configuration file having a data structure associated with the first diagnostic test by accessing the diagnostic test data table. The data structure has a first parameter variable that is set equal to the first value. The method further includes generating a diagnostic test software source code file based on the diagnostic test parameter configuration file utilizing a kernel translator program.

15 Claims, 9 Drawing Sheets

(56) References Cited

U.S. PATENT DOCUMENTS

| | | |
|---|---|---|
| 2007/0021873 A1* | 1/2007 | Richards ................. 700/286 |
| 2007/0093924 A1* | 4/2007 | Engel et al. ................. 700/104 |
| 2007/0100519 A1* | 5/2007 | Engel ..................... 701/33 |
| 2007/0294001 A1* | 12/2007 | Underdal et al. ............... 701/29 |
| 2008/0033609 A1* | 2/2008 | Razavi ...................... 701/33 |
| 2008/0228338 A1* | 9/2008 | Howard et al. ............... 701/29 |
| 2008/0228533 A1* | 9/2008 | McGuire et al. ............. 705/5 |
| 2009/0132070 A1* | 5/2009 | Ebrom et al. .............. 700/90 |
| 2010/0010702 A1* | 1/2010 | Gilbert ..................... 701/29 |
| 2010/0321030 A1* | 12/2010 | Gale et al. ................. 324/537 |
| 2012/0062378 A1* | 3/2012 | Bolling .................. 340/539.12 |
| 2012/0182039 A1* | 7/2012 | Partee ..................... 324/764.01 |
| 2013/0212528 A1* | 8/2013 | Lazaridis et al. ............ 707/722 |
| 2013/0218915 A1* | 8/2013 | Billau et al. ................ 707/755 |
| 2013/0318127 A1* | 11/2013 | West et al. ................ 707/803 |

OTHER PUBLICATIONS

Ed. Thomas—"Smart Battery System"—Circuit Cellar Ink, Issue 101 Dec. 1998 (p. 32-35).*

* cited by examiner

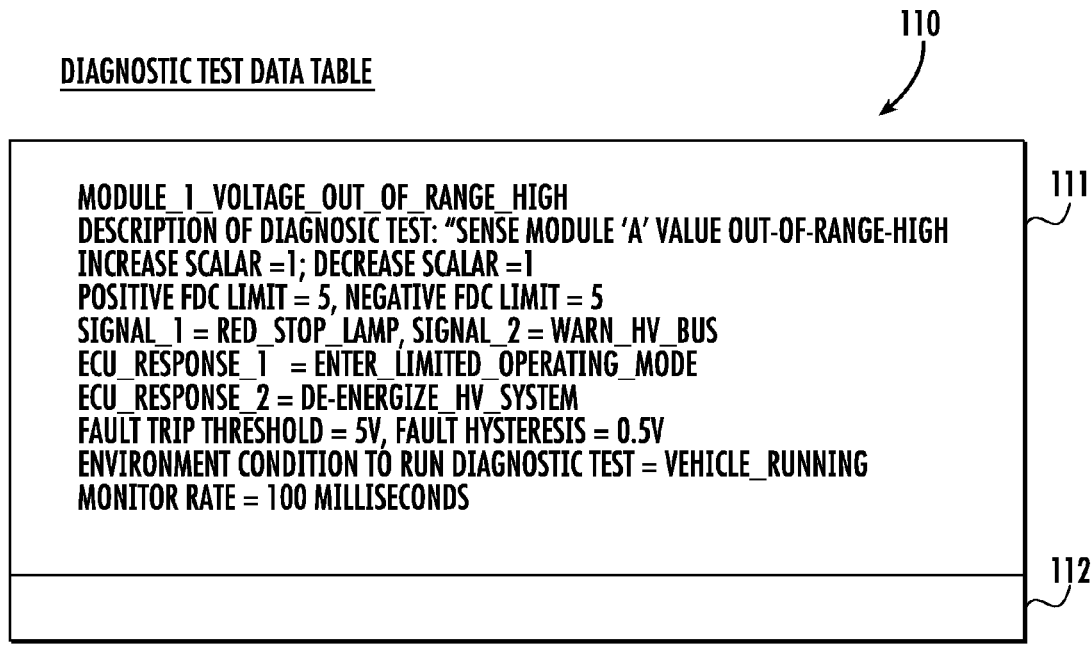

DIAGNOSTIC TEST DATA TABLE

MODULE_1_VOLTAGE_OUT_OF_RANGE_HIGH
DESCRIPTION OF DIAGNOSIC TEST: "SENSE MODULE 'A' VALUE OUT-OF-RANGE-HIGH
INCREASE SCALAR =1; DECREASE SCALAR =1
POSITIVE FDC LIMIT = 5, NEGATIVE FDC LIMIT = 5
SIGNAL_1 = RED_STOP_LAMP, SIGNAL_2 = WARN_HV_BUS
ECU_RESPONSE_1 = ENTER_LIMITED_OPERATING_MODE
ECU_RESPONSE_2 = DE-ENERGIZE_HV_SYSTEM
FAULT TRIP THRESHOLD = 5V, FAULT HYSTERESIS = 0.5V
ENVIRONMENT CONDITION TO RUN DIAGNOSTIC TEST = VEHICLE_RUNNING
MONITOR RATE = 100 MILLISECONDS

FIG. 4

DIAGNOSTIC TEST SOFTWARE SOURCE CODE RESPONSE FILE (diag_c.c file) — 270

/* EN_DIAG_MODULE_1_VOLTAGE_OORH: HYBIRD/EV BATTERY VOLTAGE SENSE "A" CIRCUIT RANGE/PERFORMANCE CIRCUIT VOLTAGE ABOVE THRESHOLD */
    {0x00000002 [ENVIRONMENTAL CONDITIONS == (b10) WHICH TRANSLATES TO == VEHICLE_RUNNING_MASK],
      ENTER_LIMIT_OPERATING_MODE
      DE-ENERGIZE_HV_SYSTEM
      DIAG_RED_STOP_LAMP_PRIORITY_2
      WARN_HV_BUS
      5V
      0.5V}

— 450

SCHEDULING ARRAY
MONITOR RATE ==100ms IS USED TO DETERMINE THE POPULATION OF THE SCHEDULER TABLE FOR FAULT 0x0016, MODULE_1_VOLTAGE_OORH, IS SCHEDULED TO BE RUN 1 TIME, IN ENTIRE DIAGNOSTIC MONITORING WINDOW (200ms, FOR COMPLETE WINDOW.)

— 470 const uint16_t kuDIAG_SCHEDULE[DIAG_SCHEDULER_ARRAY_ROWS][DIAG_SCHD_ARRAY_COLS] =
{

SYSTEM AND METHOD FOR GENERATING DIAGNOSTIC TEST FILES ASSOCIATED WITH A BATTERY PACK

BACKGROUND

The inventors herein have recognized a need for an improved system and method for generating diagnostic test files associated with a battery pack.

SUMMARY

A method for generating diagnostic test files associated with a battery pack in accordance with an exemplary embodiment is provided. The method includes providing a diagnostic test data table having a plurality of records stored in a memory device. A first record of the plurality of records is associated with a first diagnostic test of the battery pack. The first record has a first parameter identifier, a first value associated with the first parameter identifier, a second parameter identifier, a second value associated with the second parameter identifier, a fault threshold identifier, and a fault threshold value associated with the fault threshold identifier. The method further includes generating a diagnostic test parameter configuration file having a data structure associated with the first diagnostic test utilizing a computer that accesses the diagnostic test data table. The data structure has a first parameter variable that is set equal to the first value, and a second parameter variable that is set equal to the second value. The method further includes generating a diagnostic test software source code file based on the diagnostic test parameter configuration file utilizing a kernel translator program. The diagnostic test software source code file has an array with the first value and the second value that is associated with the first diagnostic test. The method further includes generating a diagnostic test software source code response file based on the diagnostic test data table utilizing the computer. The diagnostic test software source code response file has the fault threshold value, and a first response flag configured to be set to a third value based on a result of the first diagnostic test.

A system for generating diagnostic test files associated with a battery pack in accordance with another exemplary embodiment is provided. The system includes a memory device having a diagnostic test data table with a plurality of records stored therein. A first record of the plurality of records is associated with a first diagnostic test of the battery pack. The first record has a first parameter identifier, a first value associated with the first parameter identifier, a second parameter identifier, a second value associated with the second parameter identifier, a fault threshold identifier, and a fault threshold value associated with the fault threshold identifier. The system further includes a computer configured to generate a diagnostic test parameter configuration file having a data structure associated with the first diagnostic test by accessing the diagnostic test data table. The data structure has a first parameter variable that is set equal to the first value, and a second parameter variable that is set equal to the second value. The computer is further configured to generate a diagnostic test software source code file based on the diagnostic test parameter configuration file utilizing a kernel translator program. The diagnostic test software source code file has an array with the first value and the second value that is associated with the first diagnostic test. The computer is further configured to generate a diagnostic test software source code response file based on the diagnostic test data table. The diagnostic test software source code response file has the fault threshold value, and a first response flag configured to be set to a third value based on a result of the first diagnostic test.

BRIEF DESCRIPTION OF THE DRAWINGS

FIG. 4 is a schematic of an exemplary diagnostic test data table utilized in the diagnostic test file generation system of FIG. 2;

FIG. 7 is a schematic of an exemplary diagnostic test software source code response file utilized in the diagnostic test file generation system of FIG. 2;

DETAILED DESCRIPTION

Figure 1:
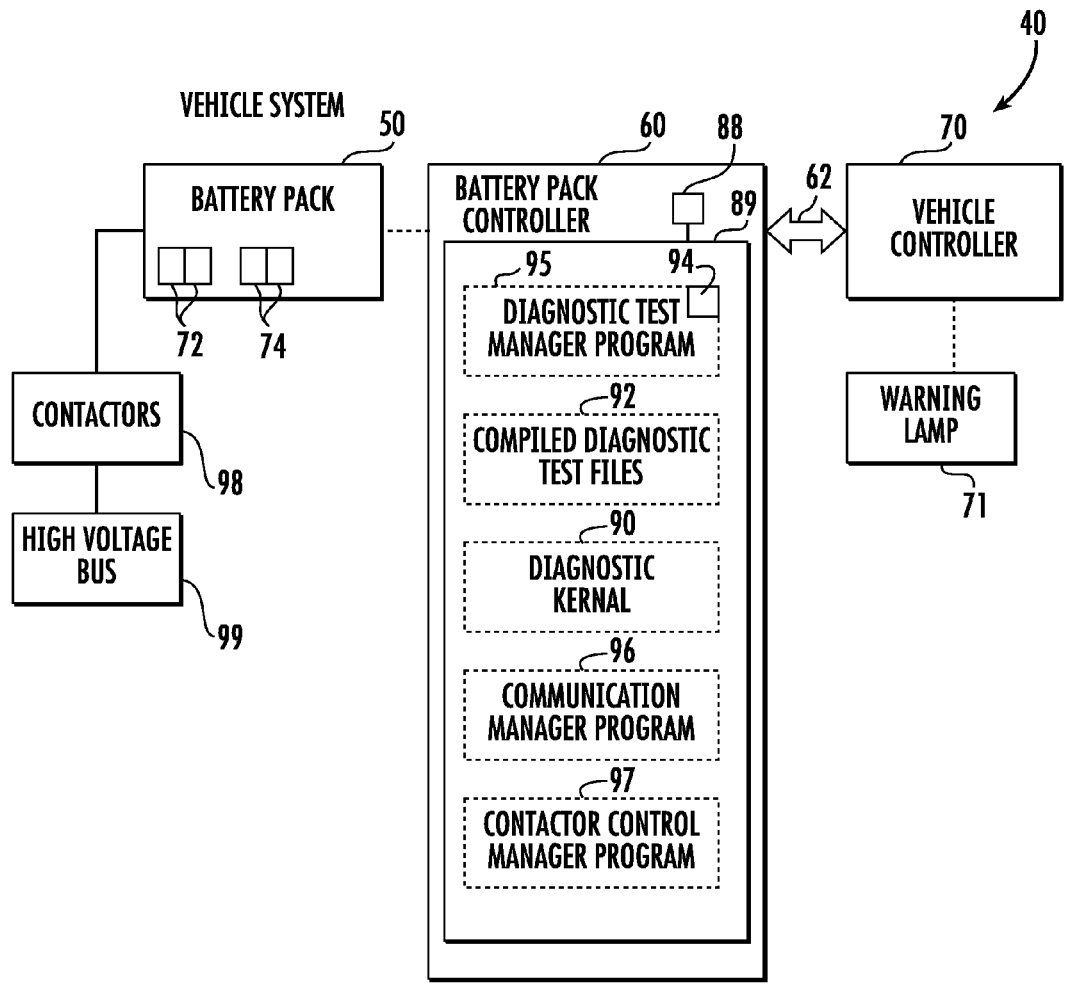
FIG. 1 is a block diagram of a vehicle system in accordance with an exemplary embodiment.

Referring to FIG. 1, a vehicle system 40 in accordance with an exemplary embodiment is provided. The vehicle system 40 includes a battery pack 50, a battery pack controller 60, a communication bus 62, a vehicle controller 70, a warning lamp 71, contactors 98, and a high-voltage bus 99.

In one exemplary embodiment, the battery pack 50 includes a plurality of battery modules 72 and a plurality of voltage sensors 74. The plurality of battery modules 72 are electrically coupled in series to one another. Each voltage sensor of the plurality of voltage sensors 74 is electrically coupled to a respective battery module 72 and generates a signal indicative of a magnitude of an output voltage from either a battery cell in the battery module 72, or an output voltage of the battery module 72, that is received by the battery pack controller 60. In one exemplary embodiment, each battery module 72 includes a plurality of pouch type lithium-ion battery cells wherein each battery cell has a generally rectangular shape. Of course, in an alternative embodiment, another type of battery cell and/or another shape of battery cell could be utilized.

The battery pack controller 60 is configured to control power distribution from the battery pack 50 and to perform diagnostic tests on the battery pack 50. The battery pack controller 60 includes a microprocessor 88 and a memory device 89. The memory device 90 includes a diagnostic kernel 90, compiled executable diagnostic test files 92, a diagnostic test manager program 95, a communication manager program 96, and a contactor control manager 97. The microprocessor 88 executes the diagnostic kernel 90 and the diagnostic test manager program 95 that utilize the compiled executable diagnostic test files 92 while executing diagnostic tests on the battery pack 50. The battery pack controller 60 utilizes the communication manager program 96 to send messages through the communication bus 62 to the vehicle controller 70. The battery pack controller 60 also generates a signal to induce the vehicle controller 70 to further generate another signal to cause a warning lamp 71 to emit light, when a first diagnostic test 94 indicates an undesired operational condition of the battery pack 50.

Figure 2:
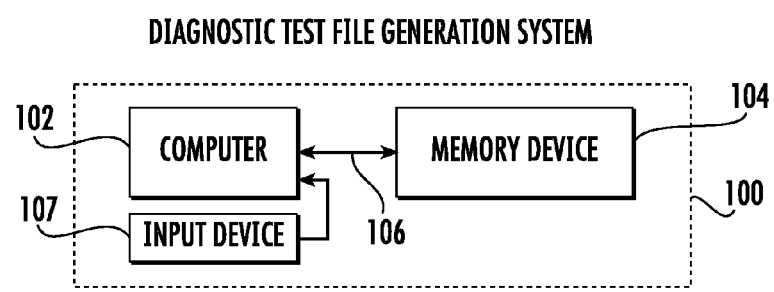
FIG. 2 is a block diagram of a diagnostic test file generation system for generating compiled diagnostic test files for use in the vehicle system of FIG. 1 in accordance with an exemplary embodiment.

Referring to FIGS. 1 and 2, a diagnostic test file generation system 100 for generating the compiled diagnostic test files 92, in accordance with an exemplary embodiment is illustrated. The diagnostic test file generation system 100 includes a computer 102 and a memory device 104 that communicates with the computer 102 via a communication bus 106. The memory device 104 includes a diagnostic kernal 90, a diagnostic test data table 110, a diagnostic test parameter generation software program 130, a diagnostic test parameter configuration file 150, a kernel translator program 170, a diagnostic test software source code file 190, a diagnostic test software source code header file 210, a compiler program 230, a diagnostic mode code generator 250, a diagnostic test software source code response file 270, a diagnostic test software source code response header file 290, and compiled diagnostic test files 92.

For purposes of understanding, an undesired operational condition, also referred to as a fault condition, corresponds to an undesired state of the battery pack 50 or the vehicle system 40 at a specific time. An undesired operational condition of either a battery cell or a battery module within the battery pack also corresponds to an undesired operational condition of the battery pack. A hard fault condition corresponds to an undesired operational condition or fault condition that has occurred at a plurality of sequential times that is confirmed by a diagnostic counter in the diagnostic kernal 90 in the battery pack controller 60.

Figure 3:
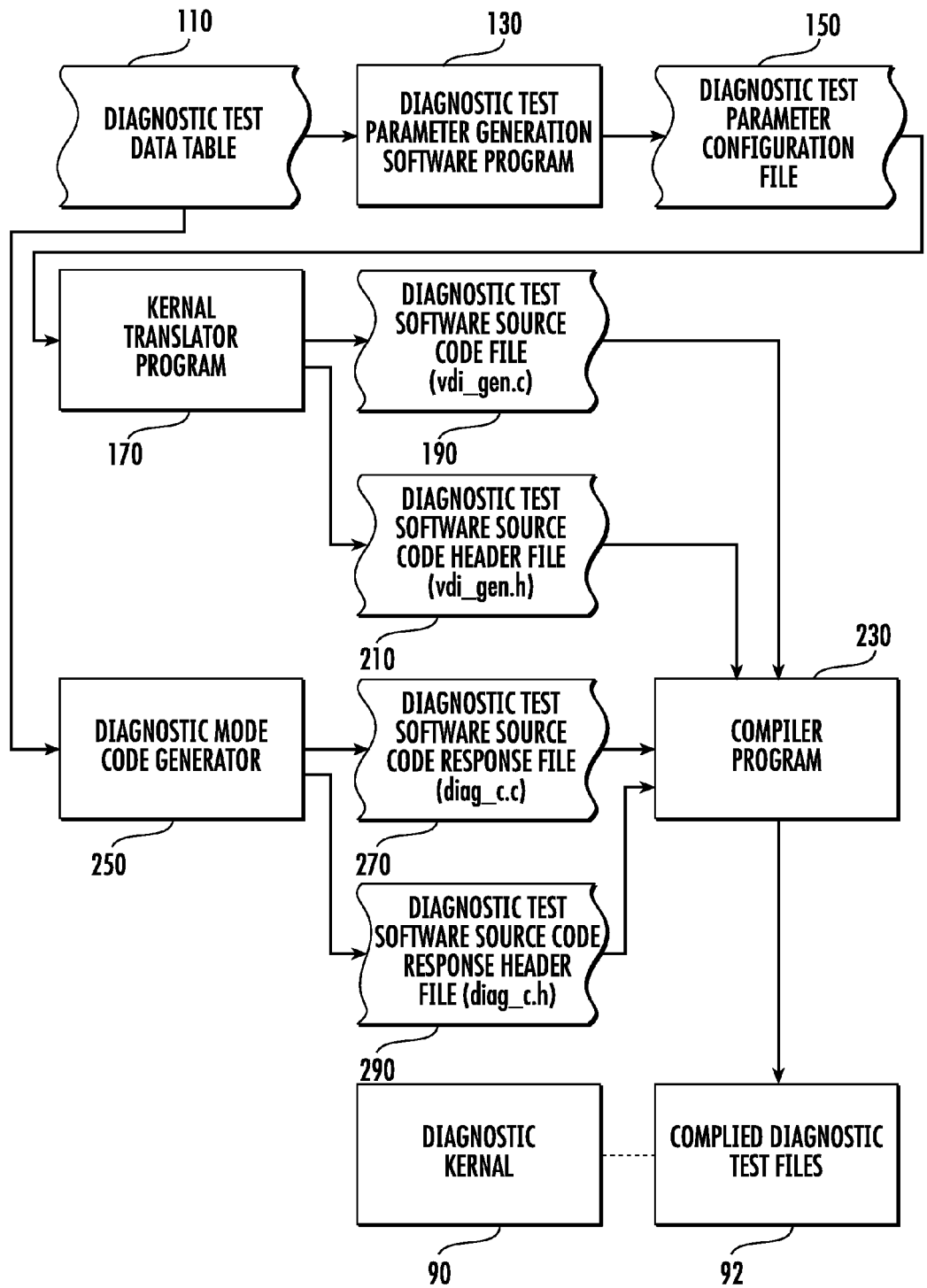
FIG. 3 is a block diagram of files and software programs utilized in the diagnostic test file generation system of FIG. 2 to generate compiled diagnostic test files.

Referring to FIGS. 1, 3 and 4, a block diagram of the files and software algorithms utilized by the diagnostic test file generation system 100 of FIG. 2 for generating the compiled executable diagnostic program 92 is illustrated.

Initially, a user utilizes the computer 102 and an input device 107 to develop a diagnostic test data table 110 to define diagnostic tests to be performed on the battery pack 50. The diagnostic test data table 110 has a plurality of records and is stored in the memory device 104. In one exemplary embodiment, each record has date that is associated with a respective diagnostic test. A first record 111 of the plurality of records has data associated with a first diagnostic test 94 of the battery pack 50. In one exemplary embodiment, the first diagnostic test 94 determines whether a battery cell or a battery module 72 is undesirably outputting a voltage level that is greater than a desired voltage level. A second record 112 is associated with a second diagnostic test. Of course, the table 110 could have a plurality of additional records.

Referring to FIGS. 1 and 4, the first record 111 includes a first parameter identifier "increase scalar", and a first value "1" associated with the first parameter identifier. The first value corresponds to an increase scalar value, and further corresponds to a kernel parameter. The increase scalar value indicates an amount to increase a diagnostic counter variable in the diagnostic kernel 90 when the first diagnostic test 94 indicates an undesired operational condition or fault condition of the battery pack 50 (e.g., an output voltage of a battery cell or the battery module 72 that is greater than a threshold voltage level).

The first record 111 further includes a second parameter identifier "decrease scalar", and a second value "1" associated with the second parameter identifier. The second value corresponds to a decrease scalar value, and further corresponds to a kernel parameter. The decrease scalar value indicates an amount to decrease a diagnostic counter variable in the diagnostic kernel 90 when the first diagnostic test 94 indicates a desired operational condition of the battery pack 50 (e.g., an output voltage of a battery cell or the battery module 72 that is less than a threshold voltage level).

The first record 111 further includes a positive failure identifier "positive fdc limit", and a third value "5" associated with the positive failure identifier. The third value corresponds to a maximum positive count of a diagnostic counter variable in the diagnostic kernel 90 that corresponds to a hard fault condition (e.g., an output voltage of a battery cell in the battery module 72, or an output voltage of the battery module 72 that is greater than a threshold voltage level) associated with the battery pack 50.

The first record 111 further includes a negative failure identifier "negative fdc limit", and a fourth value "5" associated with the negative failure identifier. The fourth value corresponds to a maximum negative count of a diagnostic counter variable in the diagnostic kernel 90 that corresponds to a hard fault condition associated with the battery pack 50.

The first record 111 further includes a diagnostic signal identifier "SIGNAL_1", and a fifth value "RED_STOP_LAMP" associated with the diagnostic signal identifier. The fifth value corresponds to a signal utilized to light a warning lamp 71 (shown in FIG. 1) when an undesired operational condition associated with the battery pack 50 occurs.

The first record 111 further includes a diagnostic signal identifier "SIGNAL_2", and a sixth value "WARN_HV_BUS" associated with the diagnostic signal identifier. The sixth value corresponds to a signal to be transmitted over the communication bus 62 (shown in FIG. 1) to indicate an undesired operational condition of the battery pack 50.

The first record 111 further includes a vehicle controller response identifier "ECU_RESPONSE_1", and a seventh value "ENTER_LIMITED_OPERATING_MODE" associated with the vehicle controller response identifier. The seventh value corresponds to a limited operational mode of the vehicle system 40, which for example could correspond to a reduction of vehicle high-voltage power limits.

The first record 111 further includes a vehicle controller response identifier "ECU_RESPONSE_2", and an eighth value "DE-ENERGIZE_HV_SYSTEM" associated with the vehicle controller response identifier. The eighth value corresponds to a de-energizing operational mode of the vehicle system 40.

The first record 111 further includes a fault trip threshold identifier "fault trip threshold", and a ninth value "5 V" associated with the fault trip threshold identifier. The ninth value associated with the fault trip threshold is a calibratable value based on a chemical composition of battery cells in the battery modules 72, and corresponds to a voltage threshold value indicating an over-voltage condition of a battery cell within the battery module 72.

The first record 111 further includes a fault hysteresis identifier "fault hysteresis", and a tenth value "0.5 V" associated with the fault hysteresis identifier. During operation, if a battery cell output voltage is greater than the ninth value (e.g., 5 Volts) for a plurality of sample periods indicating a fault condition (e.g., undesired operational condition) of the battery pack 50, the battery pack 50 is not designated as recovering from the fault condition until the battery cell output voltage has fallen below a value corresponding to the ninth value-tenth value (e.g., 5 Volts−0.5 Volts=4.5 Volts).

The first record 111 further includes an environment condition identifier "environment condition to run diagnostic test identifier"; and an eleventh value "VEHICLE_RUNNING"

associated with the environment condition identifier. The environment condition identifier indicates the operational condition of the vehicle system 40 in which the battery pack controller 60 will perform the first diagnostic test 94 on the battery pack 50.

The first record 111 further includes a monitor rate identifier "monitor rate", and a twelfth value "100 milliseconds" indicating an iterative time interval in which the first diagnostic test 94 is executed. For example, when the twelfth value is equal to "100 milliseconds", the first diagnostic test 94 is scheduled to be executed every 100 milliseconds by the diagnostic kernal 90.

Referring again to FIGS. 3 and 4, a diagnostic test parameter generation software program 130 accesses the plurality of records in the diagnostic test data table 110 and utilizes the data in the plurality of records to generate the diagnostic test parameter configuration file 150. In one exemplary embodiment, the diagnostic test parameter generation software program 130 is a C program.

Figure 5:
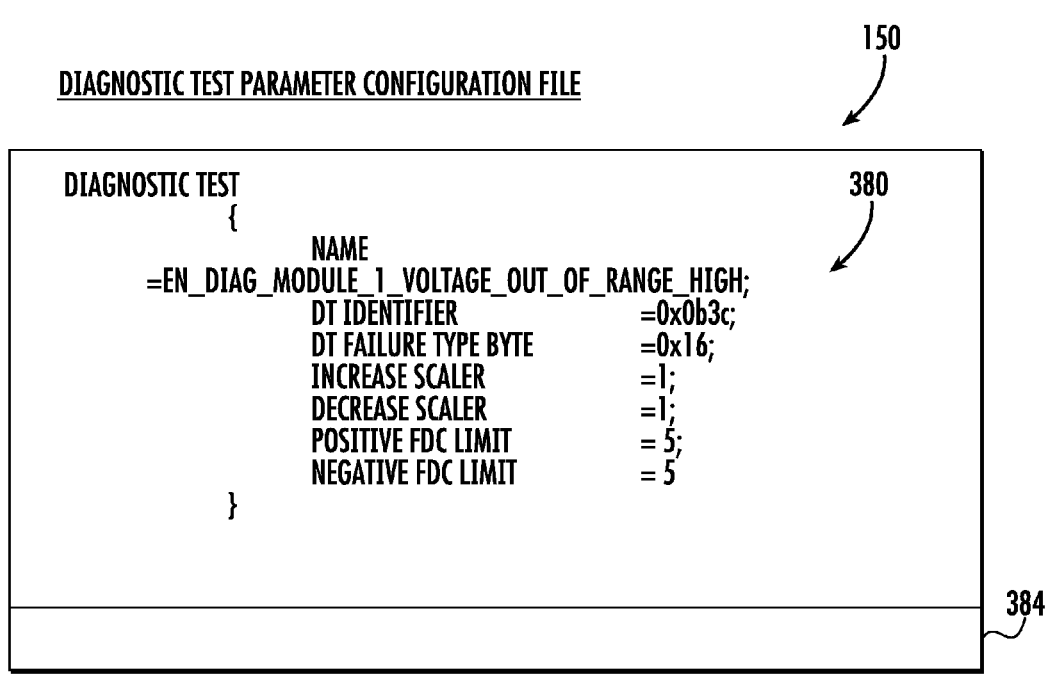
FIG. 5 is a schematic of an exemplary diagnostic test parameter configuration file utilized in the diagnostic test file generation system of FIG. 2.

Referring to FIGS. 3, 4 and 5, the diagnostic test parameter configuration file 150 has a data structure 380 named "diagnostic test" that is associated with the first diagnostic test 94. The data structure 380 has a first parameter variable "name" that is set equal to "EN_DIAG_MODULE_1_VOLTAGE_OUT_OF_RANGE_HIGH."

The data structure 380 further includes a second parameter variable "DT identifier" that is set equal to "0x0b3c." The second parameter variable corresponds to a predetermined fault code byte that will be read out and responded to by the diagnostic test manager program 95 (shown in FIG. 1). The second parameter variable is also referred to as a diagnostic trouble code. The diagnostic trouble code is associated with the first diagnostic test 94.

The data structure 380 further includes a third parameter variable "DT failure type byte" that is set equal to "0x16." The third parameter variable corresponds to a fault condition, e.g., a sensor OPEN or a sensor CLOSED.

Referring to FIGS. 4 and 5, the data structure 380 further includes a fourth parameter variable "increase scalar" that is set equal to "1." The fourth parameter variable is generated based on the first parameter identifier "increase scalar", and the first value "1" in the record 111 of the diagnostic test data table 110.

The data structure 380 further includes a fifth parameter variable "decrease scalar" that is set equal to "1." The fifth parameter variable is generated based on the second parameter identifier "decrease scalar" and the second value "1" in the record 111 of the diagnostic test data table 110.

The data structure 380 further includes a sixth parameter variable "positive fdc limit" that is set equal to "5." The sixth parameter variable is generated based on the third parameter identifier "positive fdc limit" and the third value "5" in the record 111 of the diagnostic test data table 110.

The data structure 380 further includes a seventh parameter variable "negative fdc limit" that is set equal to "5." The seventh parameter variable is generated based on the fourth parameter identifier "negative fdc limit" and the fourth value "5" in the record 111 of the diagnostic test data table 110.

Referring again to FIGS. 3, 5 and 6, a kernal translator program 170 accesses the diagnostic test parameter configuration file 150 and utilizes the data structure 380 (shown in FIG. 5) to generate both a diagnostic test software source code file 190 and a diagnostic test software source code header file 210. The diagnostic test software source code header file 210 defines the arrays utilized in the diagnostic test software source code file 190. As will be discussed in greater detail below, the diagnostic test software source code file 190 and the diagnostic test software source code header file 210 are configured to be compiled and operationally linked to the diagnostic kernel 90 (shown in FIG. 1) by the compiler program 230 for performing the first diagnostic test 94.

Figure 6:
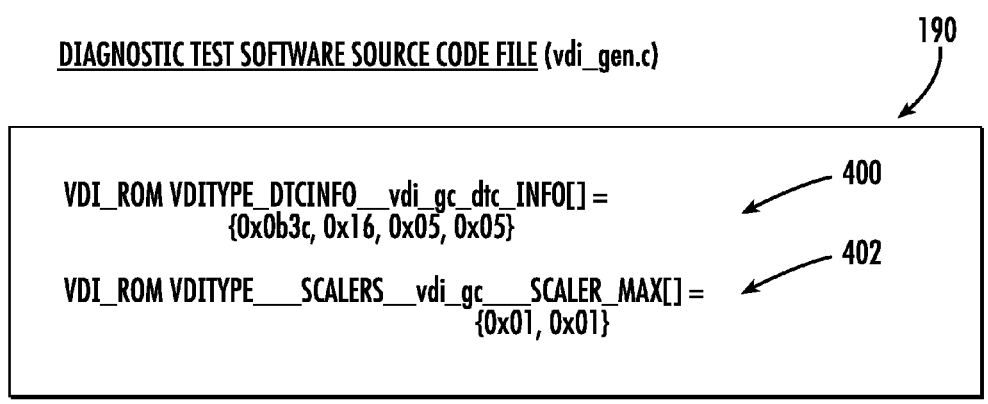
FIG. 6 is a schematic of an exemplary diagnostic test software source code file utilized in the diagnostic test file generation system of FIG. 2.
Figure 8:
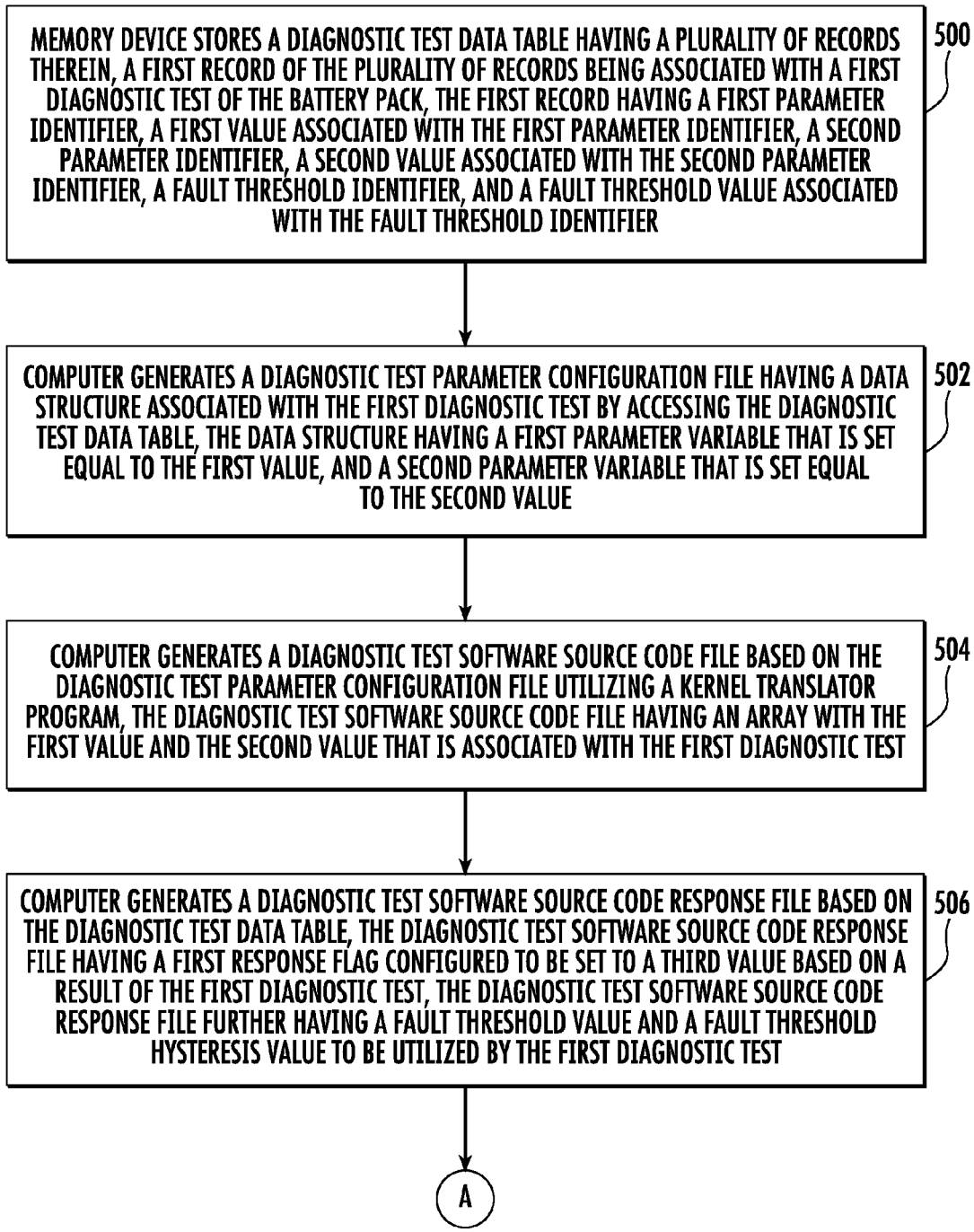
FIGS. 8 and 9 are flowcharts of a method for generating diagnostic test files associated with a battery pack in accordance with another exemplary embodiment.
Figure 9:
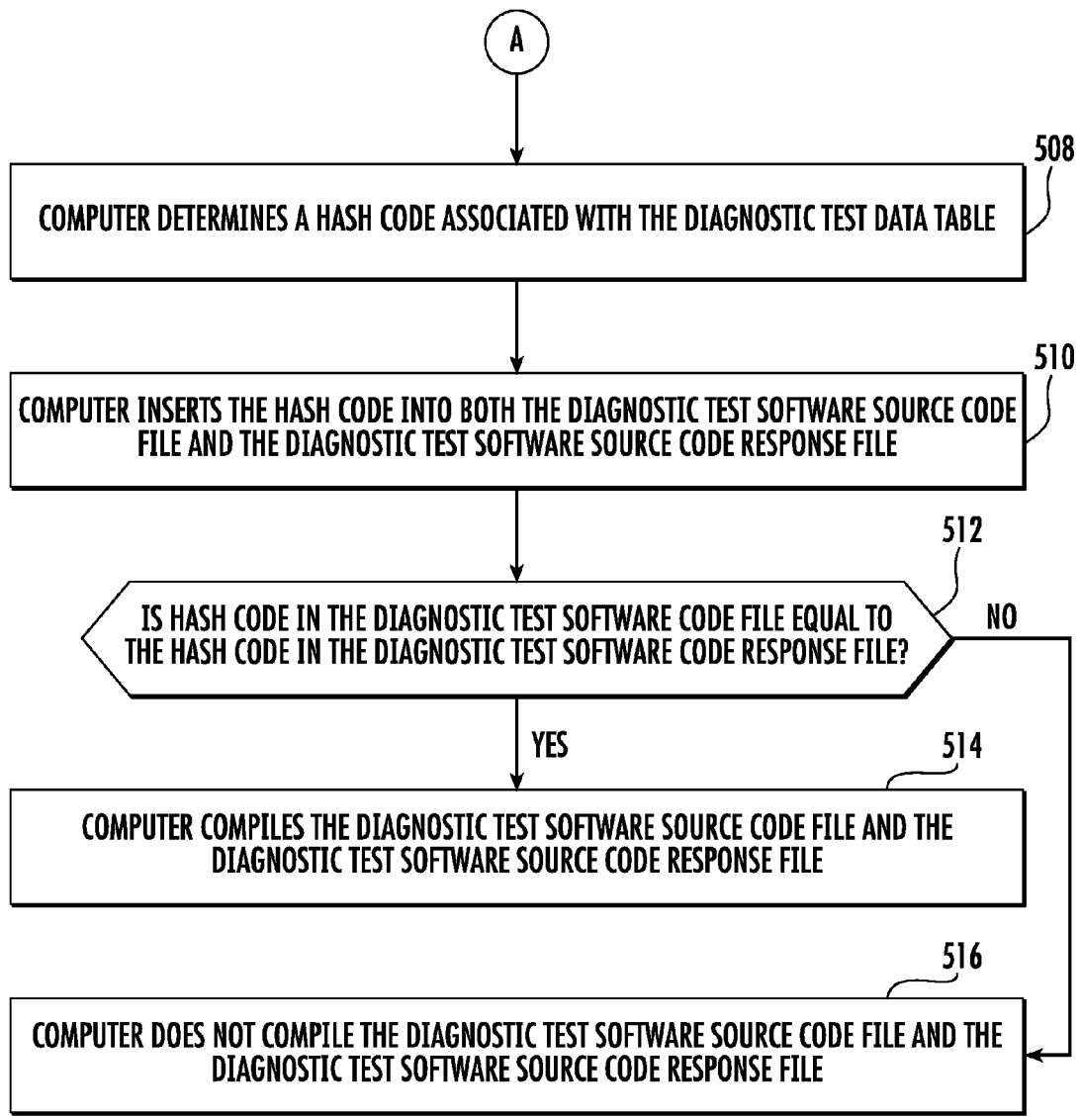
Figure 10:
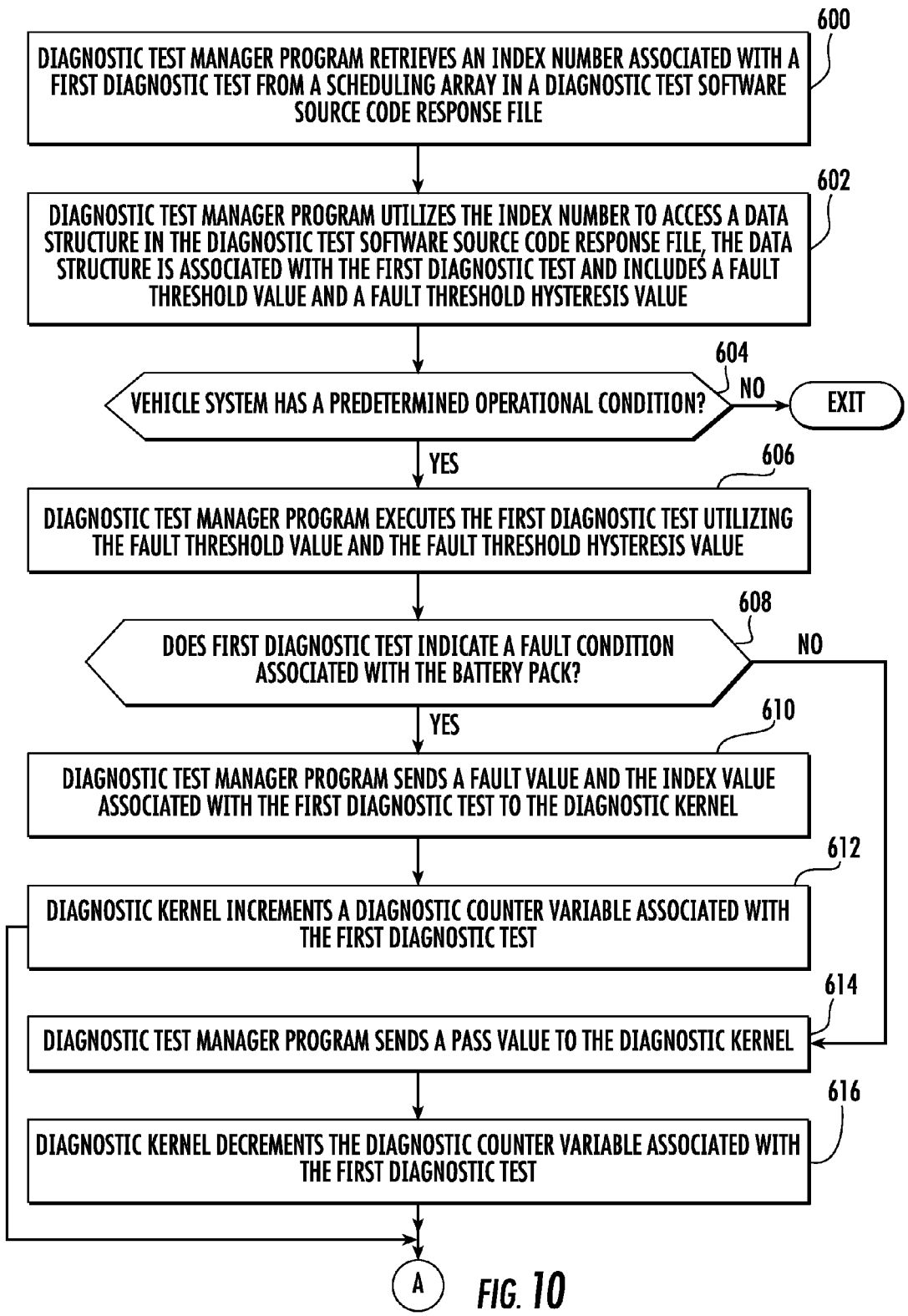
FIGS. 10 and 11 are flowcharts of a method for performing a first diagnostic test utilizing the compiled diagnostic test files in accordance with another exemplary embodiment.
Figure 11:
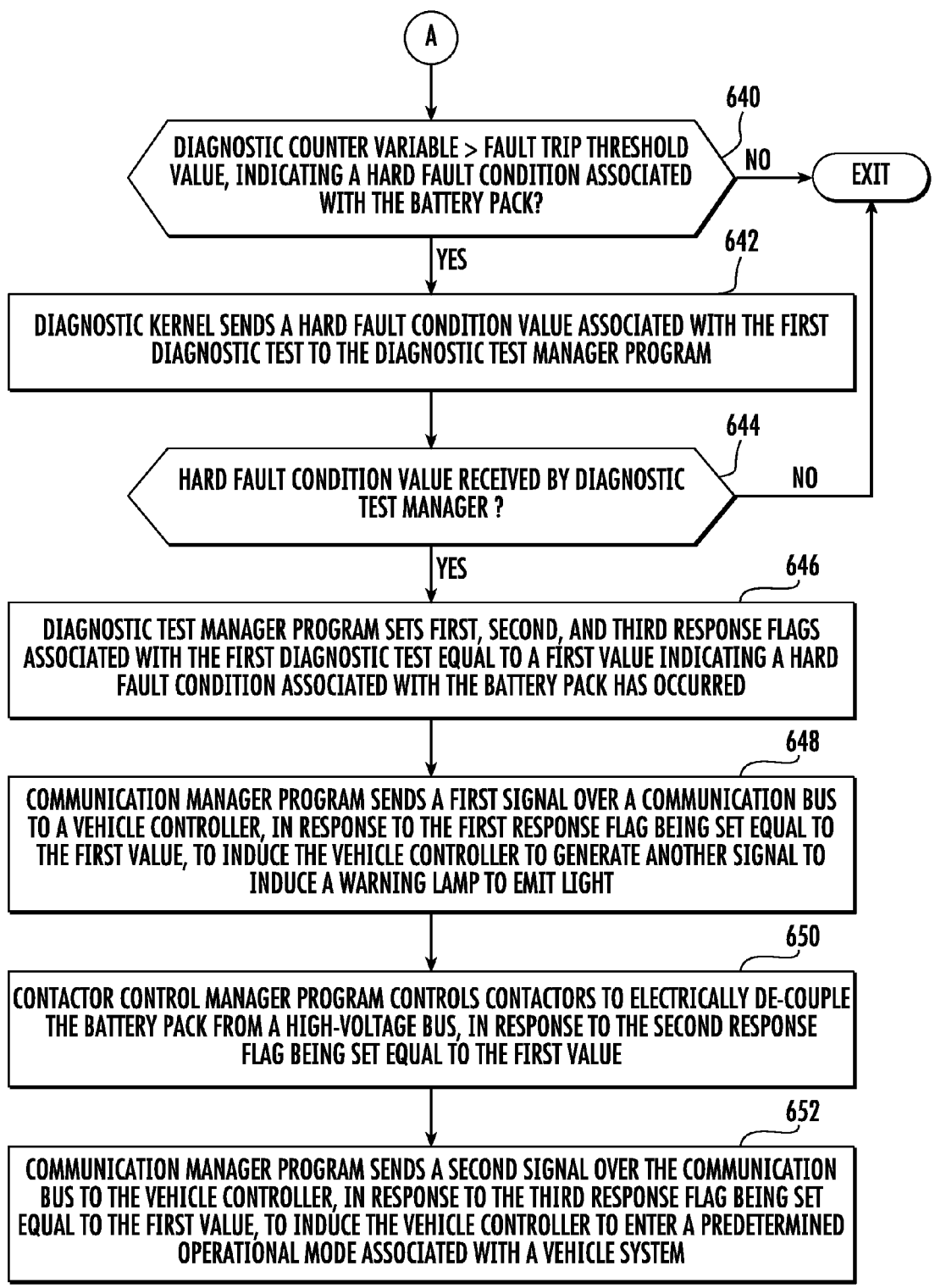

Referring to FIGS. 5 and 6, the diagnostic test software source code file 190 has an array 400 named "VDI_ROM VDIType_DTCInfo_vdi_gc_dtc_info[ ]." The array 400 has a first value "0x0b3c" corresponding to second parameter variable "DT identifier" in the data structure 380 (shown in FIG. 5). The diagnostic kernel 90 utilizes the array 400 to determine the positive fdc limit and the negative fdc limit associated with the first diagnostic test 94. The first value "0x0b3c" corresponds to a diagnostic fault code. The array 400 further includes a second value or index "0x16" corresponding to the third parameter variable "DT failure type byte" in the data structure 380. The array 400 further includes a third value "0x05" corresponding to the sixth parameter variable "positive fdc limit" in the data structure 380. The array 400 further includes a fourth value "0x05" corresponding to the seventh parameter variable "negative fdc limit" in the data structure 380.

The diagnostic test software source code file 190 further includes an array 402 named "VDI_ROM VDIType_scalers_vdi_gc_scaler_max[ ]" The array 402 has a first value "0x01" corresponding to the fourth parameter variable "increase scalar" in the data structure 380. The array 402 further includes a second value "0x01" corresponding to the fifth parameter variable "decrease scalar" in the data structure 380. The diagnostic kernel 90 utilizes the array 402 to determine the increase scalar value and the decrease scalar value associated with the first diagnostic test 94.

Referring again to FIGS. 3, 4 and 7, a diagnostic mode code generator 250 accesses the diagnostic test data table 110 and generates both a diagnostic test software source code response file 270 and a diagnostic test software source code response header file 290. The diagnostic test software source code response file 270 includes response flags (e.g., ENTER_LIMIT_OPERATING_MODE) that are set to a binary value by the diagnostic test manager program 95 (shown in FIG. 1) based on the result of the first diagnostic test 94. The diagnostic test software source code response file 270 further includes a fault threshold value (e.g., 5 V) and a fault threshold hysteresis value (e.g., 0.5 V). The diagnostic test software source code response header file 290 defines the data structure 450 utilized in the diagnostic test software source code response file 270. The diagnostic test software source code response file 270 and the diagnostic test software source code response header file 290 are configured to be compiled and operationally linked to the diagnostic kernel 90 (shown in FIG. 1) for initiating a first operation or task associated with the vehicle system 40 based on a result of the first diagnostic test 94.

Figure 7:
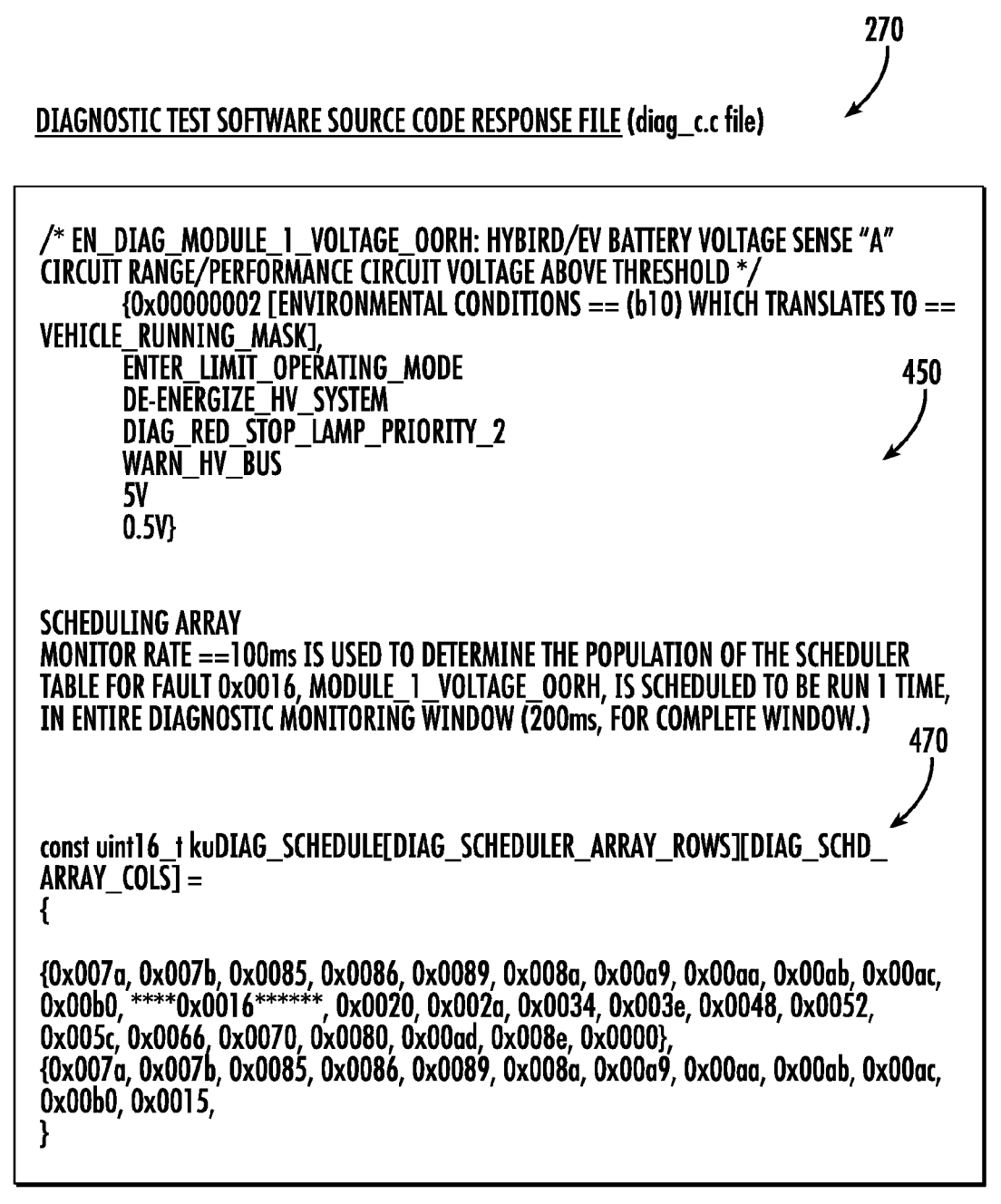

Referring to FIGS. 1 and 7, the diagnostic test software source code response file 270 will be described in greater detail. The file 270 contains response flags that are set when a fault condition (e.g., an overvoltage condition) is determined for the battery pack 50, to initiate a generation of signals or messages indicating the fault condition, and/or a initiating an operation or task by the battery pack controller 60. The file 270 also has data utilized by the diagnostic test manager 95 to perform a first diagnostic test 94.

The diagnostic test software source code response file 270 has a data structure 450 named "EN_DIAG_MODULE_1_VOLTAGE_OORH" that has data utilized by the diagnostic test manager program 95 (shown in FIG. 1) to perform a first diagnostic test 94. In an exemplary embodiment, the first diagnostic test 94 is an overvoltage diagnostic test associated with a battery cell or the battery module 72.

Of course, in alternative embodiments, other diagnostic tests could be performed. The data structure 450 has a conditional check to determine if the vehicle system 40 has a predetermined operational condition (e.g., vehicle system running") required for performing the first diagnostic test 94.

The data structure 450 further includes a response flag "ENTER_LIMIT_OPERATING MODE." When the diagnostic kernal 90 confirms that a hard fault condition (e.g., an overvoltage condition of the battery module 72 has been iteratively detected more than a predetermined number of times) has occurred based on results from the first diagnostic test 94 that are sent from the diagnostic test manager program 95 to the diagnostic kernal 90, the diagnostic test manager program 95 sets the ENTER_LIMITED_OPERATING MODE response flag to a first value that further induces the battery pack controller 60 to enter into a limited operating mode of operation associated with the vehicle system 40

The data structure 450 further includes a response flag "DE-ENERGIZE_HV_SYSTEM." When the diagnostic kernal 90 confirms that a hard fault condition has occurred based on results from the first diagnostic test 94 that are sent from the diagnostic test manager program 95 to the diagnostic kernal 90, the diagnostic test manager program 95 sets the DE-ENERGIZE_HV_SYSTEM response flag to a first value that further induces the contactor control manager program 97 to control the contactors 98 (shown in FIG. 1) to electrically de-couple the battery modules 72 from the high-voltage bus 99.

The data structure 450 further includes a response flag "DIAG_RED_STOP_LAMP_PRIORITY_2." When the diagnostic kernal 90 confirms that a hard fault condition has occurred based on results from the first diagnostic test 94 that are sent from the diagnostic test manager program 95 to the diagnostic kernal 90, the diagnostic test manager program 95 sets the DIAG_RED_STOP_LAMP_PRIORITY_2 response flag to a first value that further induces the communication manager program 97 (shown in FIG. 1) to send a first signal over the communication bus 62 to the vehicle controller 70. In response to the first signal, the vehicle controller 70 generates another signal to induce the warning lamp 71 to emit light.

The data structure 450 further includes a response flag "WARN_HV_BUS." When the diagnostic kernal 90 confirms that a hard fault condition has occurred based on results from the first diagnostic test 94 that are sent from the diagnostic test manager program 95 to the diagnostic kernal 90, the diagnostic test manager program 95 sets the WARN_HV_BUS response flag to a first value that further induces the communication manager program 97 (shown in FIG. 1) to send a second signal over the communication bus 62 to the vehicle controller 70. In response to the second signal, the vehicle controller 70 enters a predetermined operational mode associated with the vehicle system 40.

The data structure 450 further includes a value "5" indicating a fault trip threshold voltage of 5 Volts. The fault trip threshold voltage is a calibratable value based on a cell chemistry of battery cells within a battery module 72. When an output voltage of a battery cell within the battery module 72 is greater than the fault trip threshold voltage, an overvoltage condition of a battery cell or the battery module 72 has occurred. During operation, the diagnostic test manager program 95 compares a measured cell voltage with the fault trip threshold voltage in the first diagnostic test 94 to determine whether an operational fault condition (e.g., an overvoltage condition) is present in a battery module 72.

Also, the data structure 450 further includes a value "0.5" indicating a hysteresis voltage of 0.5 volts. When the diagnostic kernal 90 has indicated a hard fault condition has occurred with the battery module 72, the diagnostic test manager program 95 will not designate that the battery module 72 has recovered from the hard fault condition until an output voltage of a battery cell has fallen below the (fault trip threshold voltage-hysteresis value).

The diagnostic test software source code response file 270 further includes a scheduling array 470 named "kuDIAG_Schedule" for scheduling a plurality of diagnostic tests including the first diagnostic test 94 associated with the battery pack 50. In particular, the array 470 is utilized by the diagnostic test manager program 95 for scheduling the timing and sequencing of the plurality of diagnostic tests associated with the battery pack 50. As shown, the diagnostic code "0x0016" indicating the first diagnostic test 94 is included in the scheduling array 470. In one exemplary embodiment, the first diagnostic test 94 is performed every 100 milliseconds.

Referring to FIGS. 1, 3, 8 and 9, a flowchart of a method for generating the compiled diagnostic test files 92 associated with the battery pack in accordance with an exemplary embodiment will now be explained.

At step 500, the memory device 104 stores the diagnostic test data table 110 having a plurality of records therein. A first record of the plurality of records is associated with a first diagnostic test 94 of the battery pack 50. The first record has a first parameter identifier, a first value associated with the first parameter identifier, a second parameter identifier, a second value associated with the second parameter identifier, a fault threshold identifier, and a fault threshold value associated with the fault threshold identifier. After step 500, method advances to step 502.

At step 502, the computer 102 generates a diagnostic test parameter configuration file 150 having a data structure 380 associated with the first diagnostic test 94 by accessing the diagnostic test data table 110. The data structure 380 has a first parameter variable that is set equal to the first value, and a second parameter variable that is set equal to the second value. After step 502, the method advances to step 504.

At step 504, the computer 102 generates a diagnostic test software source code file 190 based on the diagnostic test parameter configuration file 150 utilizing a kernel translator program 170. The diagnostic test software source code file 190 has an array 400 with the first value and the second value that is associated with the first diagnostic test 94. After step 504, the method advances to step 506.

At step 506, the computer 102 generates the diagnostic test software source code response file 270 based on the diagnostic test data table 110. The diagnostic test software source code response file 270 has a first response flag configured to be set to a third value based on a result of the first diagnostic test 94. The diagnostic test software source code response file 270 further includes a fault threshold value and a fault threshold hysteresis value to be utilized by the first diagnostic test 94. After step 506, the method advances to step 508.

At step 508, the computer 102 determines a hash code associated with the diagnostic test data table 110 utilizing a hash code algorithm that generates the hash code based on the data within the diagnostic test data table 110. After step 508, the method advances to step 510.

At step 510, the computer 102 inserts the hash code into both the diagnostic test software source code file and the diagnostic test software source code response file 270. After step 510, the method advances to step 512.

At step 512, the computer 102 makes a determination as to whether the hash code in the diagnostic test software source code file 190 is equal to the hash code in the diagnostic test software source code response file 270. If the value of step 512 equals "yes", the method advances to step 514. Otherwise, the method advances to step 516.

At step 514, the computer 102 compiles the diagnostic test software source code file 190 and the diagnostic test software source code response file 270 to obtain a compiled executable diagnostic program 92.

Referring again to step 512, if the value of step 512 equals "no", the method advances to step 516. At step 516, the computer 102 does not compile the diagnostic test software source code file 190 and the diagnostic test software source code response file 270.

It is noted that when the compiled executable diagnostic program 92 has been generated, the program 92 can be stored in the memory device 89 of the battery pack controller 60.

Referring to FIGS. 1, 7, 10 and 11, a flowchart of a method for performing the first diagnostic test 94 utilizing the diagnostic test files in accordance with another exemplary embodiment will now be explained.

At step 600, the diagnostic test manager program 95 retrieves an index number associated with a first diagnostic test 94 from the scheduling array 470 in the diagnostic test software source code response file 270. After step 600, the method advances to step 602.

At step 602, the diagnostic test manager program 95 utilizes the index number to access the data structure 450 in the diagnostic test software source code response file 270. The data structure 450 is associated with the first diagnostic test 94 and includes a fault threshold value and a fault threshold hysteresis value. After step 602, the method advances to step 604.

At step 604, the diagnostic test manager program 95 makes a determination as to whether the vehicle system 40 has a predetermined operational condition. If the value of step 604 equals "yes", the method advances to step 606. Otherwise, the method is exited.

At step 606, the diagnostic test manager program 95 executes the first diagnostic test 94 utilizing the fault threshold value and the fault threshold hysteresis value. After step 606, the method advances to step 608.

At step 608, the diagnostic test manager program 95 makes a determination as to whether the first diagnostic test 94 indicated a fault condition associated with the battery pack 50. If the value of step 608 and equals "yes", the method advances to step 610. Otherwise, the method advances to step 614.

At step 610, the diagnostic test manager program 95 sends a fault value and the index value associated with the first diagnostic test 94 to the diagnostic kernel 90. After step 610, the method advances to step 612.

At step 612, the diagnostic kernel 90 increments a diagnostic counter variable associated with the first diagnostic test 94. After step 612, the method advances to step 640.

Referring again to step 608, if the value of step 608 equals "no", the method advances to step 614. At step 614, the diagnostic test manager program 95 sends a pass value to the diagnostic kernel 90. After step 614, the method advances to step 616.

At step 616, the diagnostic kernel 90 decrements a diagnostic counter variable associated with the first diagnostic test 94. After step 616, the method advances to step 640.

At step 640, the diagnostic kernel 90 makes a determination as to whether the diagnostic counter variable is greater than a fault trip threshold value, indicating a hard fault condition associated with the battery pack 50 has occurred. If the value of step 640 equals "yes", the method advances to step 642. Otherwise, the method is exited.

At step 642, the diagnostic kernel 90 sends a hard fault condition value associated with the first diagnostic test 94 to the diagnostic test manager program 95. After step 642, the method advances to step 644.

At step 644, the diagnostic test manager program 95 makes a determination as to whether the hard fault condition value was received from the diagnostic kernel 90. If the value of step 644 equals "yes", the method advances to step 646. Otherwise, the method is exited.

At step 646, the diagnostic test manager program 95 sets first, second, and third response flags (e.g., DIAG_RED_STOP_LAMP_PRIORITY_2, DE-ENERGIZE_HV_SYSTEM, WARN_HV_BUS) in the data structure 450 associated with the first diagnostic test 94 equal to a first value indicating a hard fault condition associated with the battery pack 50 has occurred. After step 646, the method advances to step 648.

At step 648, the communication manager program 96 sends a first signal over the communication bus 62 to the vehicle controller 70, in response to the first response flag being set equal to the first value, to induce the vehicle controller 70 to generate another signal to induce the warning lamp 71 to emit light. After step 648, the method advances to step 650.

At step 650, the contactor control manager program 97 controls contactors 98 to electrically de-couple the battery pack 50 from the high-voltage bus 99, in response to the second response flag being set equal to the first value. After step 650, the method advances to step 652.

At step 652, the communication manager program 96 sends a second signal over the communication bus 62 to the vehicle controller 70, in response to the third response flag being set equal to the first value, to induce the vehicle controller 70 to enter a predetermined operational mode associated with the vehicle system 40. After step 652, the method is exited.

The diagnostic test file generation system 100 and the method for generating diagnostic test files associated with the battery pack 50 provide a substantial advantage over other systems and methods. In particular, the system 100 and the method for generating diagnostic test files utilize a diagnostic test data table 100 and a diagnostic test parameter generation software program 130 to automatically generate a diagnostic test parameter configuration file 150. Thus, diagnostic test data is defined in the diagnostic test data table 110 and then utilized to determine the diagnostic test parameter configuration file 150. Thereafter, a kernel translator program 170 generates a test software source code file 190 based on the file 150. The test source code file 190 can be compiled to obtain a compiled executable diagnostic program 92 which is operationally linked with the diagnostic kernel 90.

The above-described methods can be at least partially embodied in the form of one or more computer readable media having computer-executable instructions for practicing the methods. The computer-readable media can comprise one or more of the following: hard drives, flash memory, and other computer-readable media known to those skilled in the art; wherein, when the computer-executable instructions are loaded into and executed by one or more computers, the one or more computers become an apparatus for practicing the methods.

For purposes of understanding, the term "controller" means at least one of a computer, a microprocessor, and an integrated circuit. Also, the term "data structure" means any software element capable of storing at least one of a software variable, a software flag, a software constant value, a software command, and data. For example, a data structure can be a software object, or a software array, or a software record, or a software file, or a software table.

Also, in alternative embodiments, the above methods for generating diagnostic test files and for performing diagnostic tests could be implemented in vehicle systems utilizing internal combustion engines. Thus, for such alternative embodiments, the term "battery pack" in the below claims and the above described flowcharts could be replaced with term "engine" or "internal combustion engine" or "electronic controller" or "electronic control unit" or "engine controller" or "engine control unit."

While the claimed invention has been described in detail in connection with only a limited number of embodiments, it should be readily understood that the invention is not limited to such disclosed embodiments. Rather, the claimed invention can be modified to incorporate any number of variations, alterations, substitutions or equivalent arrangements not heretofore described, but which are commensurate with the spirit and scope of the invention. Additionally, while various embodiments of the claimed invention have been described, it is to be understood that aspects of the invention may include only some of the described embodiments. Accordingly, the claimed invention is not to be seen as limited by the foregoing description.

What is claimed is:

1. A method for generating diagnostic test files associated with a battery pack, comprising:
    providing a diagnostic test data table having a plurality of records stored in a memory device, a first record of the plurality of records being associated with a first diagnostic test of the battery pack, the first record having a first parameter identifier, a first value associated with the first parameter identifier, and a second parameter identifier, a second value associated with the second parameter identifier, a fault threshold identifier, and a fault threshold value associated with the fault threshold identifier;
    generating a diagnostic test parameter configuration file having a data structure associated with the first diagnostic test utilizing a computer that accesses the diagnostic test data table, the data structure having a first parameter variable that is set equal to the first value, and a second parameter variable that is set equal to the second value;
    generating a diagnostic test software source code file based on the diagnostic test parameter configuration file utilizing a kernel translator program, the diagnostic test software source code file having an array with the first value and the second value that is associated with the first diagnostic test;
    generating a diagnostic test software source code response file based on the diagnostic test data table utilizing the computer, the diagnostic test software source code response file having the fault threshold value, and a first response flag configured to be set to a third value based on a result of the first diagnostic test; and
    compiling and operationally linking the diagnostic test software source code file and the diagnostic test software source code response file to a diagnostic kernel for performing the first diagnostic test, utilizing the computer, the first value corresponding to an increase scalar value, the increase scalar value indicating an amount to increase a diagnostic counter variable in the diagnostic kernel when the first diagnostic test indicates an undesired operational condition of the battery pack, the diagnostic counter variable being associated with the first test.

2. The method of claim 1, wherein the second value corresponds to a decrease scalar value, the decrease scalar value indicating an amount to decrease a diagnostic counter variable in the diagnostic kernel when the first diagnostic test indicates a desired operational condition of the battery pack, the diagnostic counter variable being associated with the first diagnostic test.

3. The method of claim 1, wherein the diagnostic test software source code response file further includes a fault threshold hysteresis value to be utilized in the first diagnostic test.

4. The method of claim 1, wherein when the first response flag is set to the third value, the first response flag indicates that a hard fault condition of the battery pack has occurred and induces the computer to enter a predetermined operating mode.

5. The method of claim 1, wherein when the first response flag is set to the third value, the first response flag indicates that a hard fault condition of the battery pack has occurred and induces the computer to further send a first signal over a communication bus.

6. The method of claim 5, wherein the first signal corresponds to a signal utilized to light a warning lamp associated with the battery pack.

7. The method of claim 1, further comprising:
    determining a hash code associated with the diagnostic test data table utilizing the computer; and
    inserting the hash code into both the diagnostic test software source code file and the diagnostic test software source code response file, utilizing the computer.

8. The method of claim 1, further comprising:
    comparing the hash code in the diagnostic test software source code file to the hash code in the diagnostic test software source code response file utilizing the computer; and
    compiling the diagnostic test software source code file and the diagnostic test software source code response file utilizing the computer only if the hash code in the diagnostic test software source code file is identical to the hash code in the diagnostic test software source code response file.

9. The method of claim 1, wherein the diagnostic test software source code response file further includes a scheduling array that includes an index associated with the first diagnostic test for scheduling execution of the first diagnostic test.

10. A system for generating diagnostic test files associated with a battery pack, comprising:
    a memory device having a diagnostic test data table with a plurality of records stored therein, a first record of the plurality of records being associated with a first diagnostic test of the battery pack, the first record having a first parameter identifier, a first value associated with the first parameter identifier, a second parameter identifier, a second value associated with the second parameter identifier, a fault threshold identifier, and a fault threshold value associated with the fault threshold identifier;
    a computer configured to generate a diagnostic test parameter configuration file having a data structure associated with the first diagnostic test by accessing the diagnostic test data table, the data structure having a first parameter variable that is set equal to the first value, and a second parameter variable that is set equal to the second value;

the computer further configured to generate a diagnostic test software source code file based on the diagnostic test parameter configuration file utilizing a kernel translator program, the diagnostic test software source code file having an array with the first value and the second value that is associated with the first diagnostic test;

the computer further configured to generate a diagnostic test software source code response file based on the diagnostic test data table, the diagnostic test software source code response file having the fault threshold value, and a first response flag configured to be set to a third value based on a result of the first diagnostic test; and the computer further configured to compile and operationally link the diagnostic test software source code file and the diagnostic test software source code response file to a diagnostic kernel for performing the first diagnostic test, the first value corresponding to an increase scalar value, the increase scalar value indicating an amount to increase a diagnostic counter variable in the diagnostic kernel when the first diagnostic test indicates an undesired operational condition of the battery pack, the diagnostic counter variable being associated with the first diagnostic test.

11. The system of claim 10, wherein the second value corresponds to a decrease scalar value, the decrease scalar value indicating an amount to decrease a diagnostic counter variable in the diagnostic kernel when the first diagnostic test indicates a desired operational condition of the battery pack, the diagnostic counter variable being associated with the first diagnostic test.

12. The system of claim 10, wherein the diagnostic test software source code response file further includes a fault threshold hysteresis value to be utilized in the first diagnostic test.

13. The system of claim 10, wherein when the first response flag is set to the third value, the first response flag indicates that a hard fault condition of the battery pack has occurred, the computer being further configured to enter a predetermined operating mode in response to the first response flag being set to the third value.

14. The system of claim 10, wherein when the first response flag is set to the third value, the first response flag indicates that a hard fault condition of the battery pack has occurred, the computer being further configured to send a first signal over a communication bus in response to the first response flag being set to the third value.

15. A method for generating diagnostic test files associated with a battery pack, comprising:

providing a diagnostic test data table having a plurality of records stored in a memory device, a first record of the plurality of records being associated with a first diagnostic test of the battery pack, the first record having a first parameter identifier, a first value associated with the first parameter identifier, and a second parameter identifier, a second value associated with the second parameter identifier, a fault threshold identifier, and a fault threshold value associated with the fault threshold identifier;

generating a diagnostic test parameter configuration file having a data structure associated with the first diagnostic test utilizing a computer that accesses the diagnostic test data table, the data structure having a first parameter variable that is set equal to the first value, and a second parameter variable that is set equal to the second value;

generating a diagnostic test software source code file based on the diagnostic test parameter configuration file utilizing a kernel translator program, the diagnostic test software source code file having an array with the first value and the second value that is associated with the first diagnostic test; and generating a diagnostic test software source code response file based on the diagnostic test data table utilizing the computer, the diagnostic test software source code response file having the fault threshold value, and a first response flag configured to be set to a third value based on a result of the first diagnostic test;

determining a hash code associated with the diagnostic test data table utilizing the computer;

inserting the hash code into both the diagnostic test software source code file and the diagnostic test software source code response file, utilizing the computer;

comparing the hash code in the diagnostic test software source code file to the has code in the diagnostic test software source code response file utilizing the computer; and compiling the diagnostic test software source code file and the diagnostic test software source code response file utilizing the computer only if the hash code in the diagnostic test software source code file is identical to the hash code in the diagnostic test software source code response file.

* * * * *